United States Patent [19]

Amagasa

[11] Patent Number: 4,492,999
[45] Date of Patent: Jan. 8, 1985

[54] SUPERVISORY UNIT FOR ROTARY ELECTRICAL MACHINERY AND APPARATUS

[75] Inventor: Nobutada Amagasa, Kobe, Japan

[73] Assignee: Mitsubishi Denki Kabushiki Kaisha, Tokyo, Japan

[21] Appl. No.: 456,013

[22] PCT Filed: May 10, 1982

[86] PCT No.: PCT/JP82/00161
   § 371 Date: Dec. 15, 1982
   § 102(e) Date: Dec. 15, 1982

[87] PCT Pub. No.: WO82/04164
   PCT Pub. Date: Nov. 25, 1982

[30] Foreign Application Priority Data

May 9, 1981 [JP] Japan ................. 56-71813
May 9, 1981 [JP] Japan ................. 56-71814
May 9, 1981 [JP] Japan ................. 56-71815

[51] Int. Cl.³ .............................................. H02H 7/06
[52] U.S. Cl. ............................... 361/21; 361/86; 322/29; 322/58
[58] Field of Search .............. 361/20, 21, 23, 33, 361/86; 322/28, 29, 32, 34, 20, 22, 25, 58

[56] References Cited

U.S. PATENT DOCUMENTS 4,074,180 2/1978 Sharpe et al. .................. 361/20 X
4,329,637 5/1982 Kotake et al. .................. 361/20 X
4,377,780 3/1983 Bjorklund ...................... 361/20 X

FOREIGN PATENT DOCUMENTS 2832845 2/1979 Fed. Rep. of Germany ........ 361/20

Primary Examiner—Patrick R. Salce
Attorney, Agent, or Firm—Bernard, Rothwell & Brown

[57] ABSTRACT

A supervisory unit for detecting abnormalities in shaft voltage of rotary electrical machinery and apparatus such as brushless synchronous machines. The supervisory unit includes a first detector for detecting the voltage across at least two points of the rotor shaft, a second detector for detecting the voltage between the rotor shaft and ground, and a third detector for detecting an electrical condition of an AC exciter which constitutes part of the field system of the apparatus. The third detector may detect electrical signals indicative of the field system voltage or the field system current. The supervisory unit includes a voltage comparator and a frequency comparator which receive detection signals from the three detectors to provide a signal indicating abnormality when an abnormal condition occurs, such as contact failure of a grounding brush or a failure in coil insulation.

4 Claims, 4 Drawing Figures

SUPERVISORY UNIT FOR ROTARY ELECTRICAL MACHINERY AND APPARATUS

TECHNICAL FIELD

The present invention relates to a supervisory unit for rotary electrical machinery and apparatus by which abnormal phenomena appeared on shaft voltage of the rotary electrical machinery and apparatus such as synchronous machine and the like are detected.

TECHNICAL BACKGROUND

In synchronous machines, voltage of several volts—ten-odd volts generates on the rotating shaft due to imbalance in magnetic flux or magnetomotive force, accumulation of charge derived from fluid in a turbine, grounding of the coil or the like. Such shaft voltage breaks down oil film on the shaft bearing and shaft current flows therethrough so that the bearing is damaged. Shaft voltage contains AC component and DC component, and the AC component involves mainly synchronous machine fundamental frequency (primary one: 50 Hz or 60 Hz) and synchronous machine tertiary harmonic wave (150 Hz or 180 Hz).

In the case where an excitation device of brushless excitation system type is employed, power source frequencies of the AC exciter appear as the AC component, while almost the same frequencies as that of the synchronous machine come out in the case where a thyristor type exciting device is used.

Heretofore, such a means in which a brush is allowed to contact with its shaft and a voltage across the shaft and the ground is determined has been known as a means for supervising shaft voltage of such type of synchronous machines. If a brushless turbine generator is taken as an example, the generator is constructed such that usually an earthing brush is mounted on its turbine side, and at the same time another brush is permitted to contact with a shaft of a brushless exciter on the opposite side of the turbine or a shaft of the turbine generator on the side of the brushless exciter to connect the brush with the ground through a resistance circuit, whereby a voltage value across both ends of the resistance circuit is detected to supervise abnormality in value of such shaft voltage.

However, in such supervisory unit as mentioned above, when the resistance circuit is short-circuited or when the brush becomes uncontacted with respect to the shaft, the shaft voltage cannot be detected and therefore, reliability of such supervisory unit is poor as the one for brushless synchronous machines.

DISCLOSURE OF THE INVENTION

A supervisory unit for rotary electrical machinery and apparatus according to the present invention is provided with a detector for obtaining a voltage signal across at least two points of a rotor shaft, another detector for obtaining a voltage signal between the rotor shaft and the ground, still another detector for detecting an electrical signal of a constituent on the field system side of the rotary electrical machinery and apparatus, and an abnormality detector for giving a signal of abnormality at the time when values of voltage and frequency of the shaft voltage are abnormal on the basis of the detection signals of these detectors. Accordingly, the supervisory unit for rotary electrical machinery and apparatus by which supervision of such shaft voltage can positively be effected, and causes for or positions of abnormal phenomena can be determined or discriminated may be obtained.

THE MOST PREFERRED MODE FOR EMBODYING THE INVENTION

Figure 1:
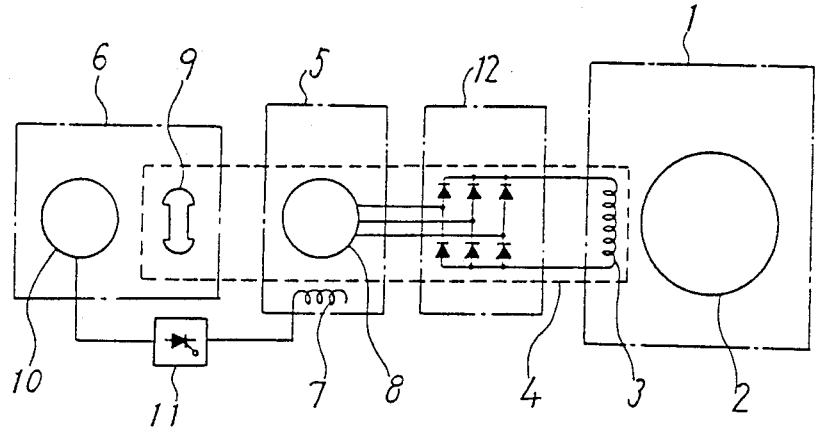
FIG. 1 is a constructional diagram illustrating a brushless synchronous machine to which a supervisory unit for rotary electrical machinery and apparatus according to the present invention is applied.

FIG. 1 is a view for illustrating a construction of a brushless synchronous machine which is to be used for the present invention in which the synchronous machine (1) involves an armature (2) and a field system (3), and rotors of an AC exciter (5) and a subexciter (6) are directly connected to a rotor shaft (4) to integrally construct the machine. Furthermore, reference characters (7) and (8) designate a field system and an armature in the aforesaid AC exciter (5) and (9) and (10) designate a field system and an armature in the aforesaid subexciter (6), respectively, and field current flowing into the aforesaid field system (7) of the AC exciter (5) is arranged so as to be regulated by means of an automatic voltage regulator AVR (11) connected with the armature (10) of the subexciter (6). On the other hand, current supplied to the field system (3) of the synchronous machine (1) is arranged so as to be fed through a rotary rectifier (12) connected to the output end of the armature (8) of the aforesaid AC exciter (5).

Figure 2:
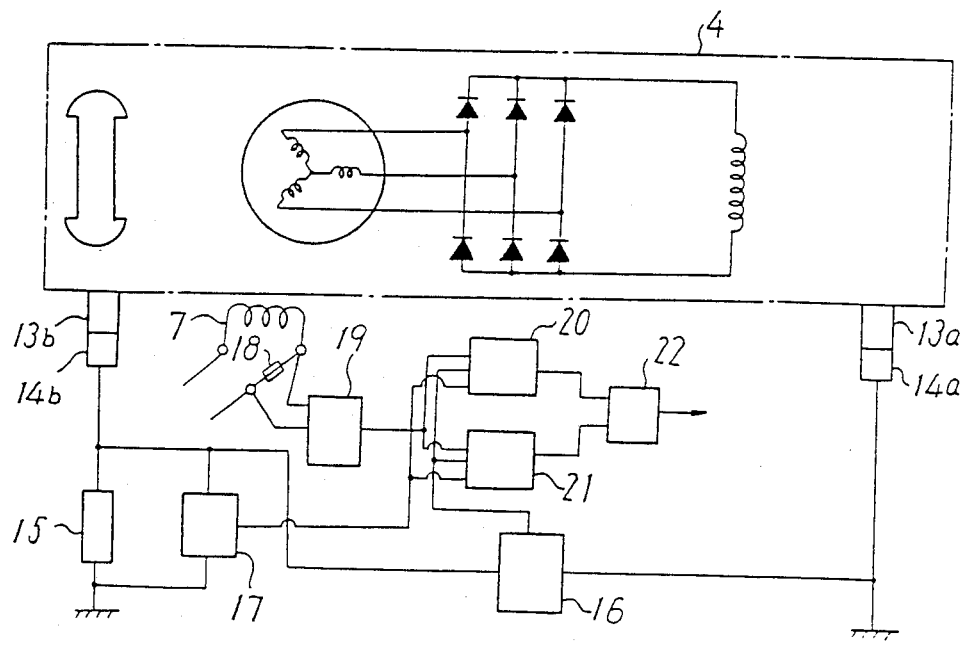
FIG. 2 is a constructional diagram illustrating the present invention.

Meanwhile, FIG. 2 illustrates a specific embodiment of a means for supervising shaft voltage of the brushless synchronous machine constructed as described above in which an end of the rotor shaft (4) of the above brushless synchronous machine (1), the aforesaid end being directly connected to the driving shaft of a turbine or the like, is grounded through a detection slip ring (13a) and a detection brush (14a) contacting with the slip ring (13a), whilst the other end of the rotor shaft is grounded through a detection slip ring (13b), a detection brush (14b) and a resistance circuit (15), whereby shaft voltage produced across two points of the rotor shaft (4) is detected by means of a shaft voltage detector (16). In this case, as the brush (14a), an earthing brush usually employed (which connects shaft voltage to earth potential in order to prevent high voltage due to accumulated charge or tertiary harmonic wave overvoltage of a thyristor type device) may be utilized. Furthermore, the supervisory unit is constructed such that a detector (17) for detecting a voltage across both ends of the aforesaid resistance circuit (15) is provided. A detector is provided (19) for detecting a voltage across both ends of a current shunt (18) connected with an end of the field system (7) of the AC exciter (5). Values of voltage and frequency of a voltage signal across two points of the rotor shaft (4) are compared with each other by means of a voltage comparator (20) and a frequency comparator (21) on the basis of detection signals of these voltage detectors (16), (17) and (19) to provide abnormal signal by means of an abnormality detection circuit (22) at the time of an abnormal occurrence.

Accordingly, amounts of voltage signals and voltage frequencies of the detectors (16) and (17) are compared.

More specifically, either a voltage $V_1$ detected of the voltage detector (17) is rectified to obtain a full voltage average value, or the voltage $V_1$ detected is differentiated to convert the same into AC voltage values. These voltage values are compared whether they are higher than a reference value or not in the case where contact failure of the earthing brush arises so that the shaft cannot contact with the earthing brush, whereby excess shaft voltage is produced. As a result, if the above voltage values are higher than the reference value, such situation is deemed to be abnormal. Moreover, in the case where insulation is destroyed to provide contact between a coil and the shaft, whereby whose rotor circuit is grounded, its abnormality is discriminated by such manner that whether or not the voltages $V_2$ and $V_1$ detected of the voltage detectors (16) and (17) are a reference value or less, or the voltage detected is subjected to waveform sampling. The resulting voltage is processed by way of Fourier analysis while storing the same, and the voltage is operated in respect of frequency component to find the frequency component in the voltages $V_1$ and $V_2$ or to find a ratio of primary and tertiary components in exciters for the voltages $V_1$ and $V_2$ to determine whether frequency components with a certain value or more are included or not in the exciters.

Besides, in the case where the winding of the synchronous machine is locally short-circuited to cause imbalance in respect of the magnetic flux magnetomotive force, a ratio of primary and tertiary frequency components of the synchronous machine is detected in respect of the voltage $V_2$ and $V_1$ of the voltage detectors (16) and (17) so that if these components are included in these voltages, with a certain ratio or more, such situation is judged to be abnormal. Accordingly, the present invention is not only utilized for improving precision and reliability of supervisory measuring instruments, but also for discriminating causes of abnormality, position and the like of shaft voltage. In addition, since there is also such a case where abnormality of shaft voltage is influenced by an amount of load, an amount of field current of the AC exciter (5) is detected by the current shunt (18), and detection signal of the detector (19) is added as data, whereby, for instance, contact failure of the brush or the like can be checked so that particularly capture of its transient variable component comes to be also an effective supervising method. Besides, when an abnormally high frequency signal is supervised, abnormality such as partial break-down of a field conductor can also be detected.

Next, another embodiment of the present invention will be described hereinbelow by referring to FIG. 3 in which reference characters (103) and (203) designate a stator and rotor for a rotary electrical apparatus, respectively, and the rotary electrical apparatus being provided with a rotor shaft (4) supported by bearings (303a) and (303b) receives supply of excitation from a slip ring (503) and is driven by a prime mover (not shown) on the opposite side of the slip ring, whereby the field system is rotated so that power generation becomes possible by means of an armature being the stator (103). Further, the excitation is power source-supplied from an exciter (not shown) utilizing a thyristor through a field brush (603).

Meantime, reference characters (703a) and (703b) designate earthing brushes, respectively, and they are protected in such a manner that the earthing brush (703a) is contacted with the rotor shaft (4) thereby to ground, for example, shaft voltage produced by means of ripple component of the thyristor exciter, whereby such an over-voltage which might destroy a shaft insulation inserted in the bearing is not added thereto. However, it becomes serious problem in the case where the earthing brush (703a) is worn out due to its abrasion so that the brush does not contact with the shaft, particularly in the case where there is no shaft insulation. Furthermore, when insulation of the field coil is broken, or when there is abnormality in the conductor on the side of the stator (103), shaft voltage is produced due to potential involved in the shaft or imbalance in magnetic flux. In order to meet such situation as mentioned above, this embodiment of the supervisory unit is constructed such that voltage is detected by a voltage detector (16) through the earthing brushes (703a) and (703b) disposed on the opposite ends of the rotor shaft (4). Moreover, the unit is provided with a voltage detector (19) for detecting field voltage from both ends of the field circuit. In this case, ripple component of the field voltage detected from this detector is determined by means of output frequency of the thyristor exciter (not shown), and the magnitude thereof is proportional to the amount of the excitation thereof.

Figure 3:
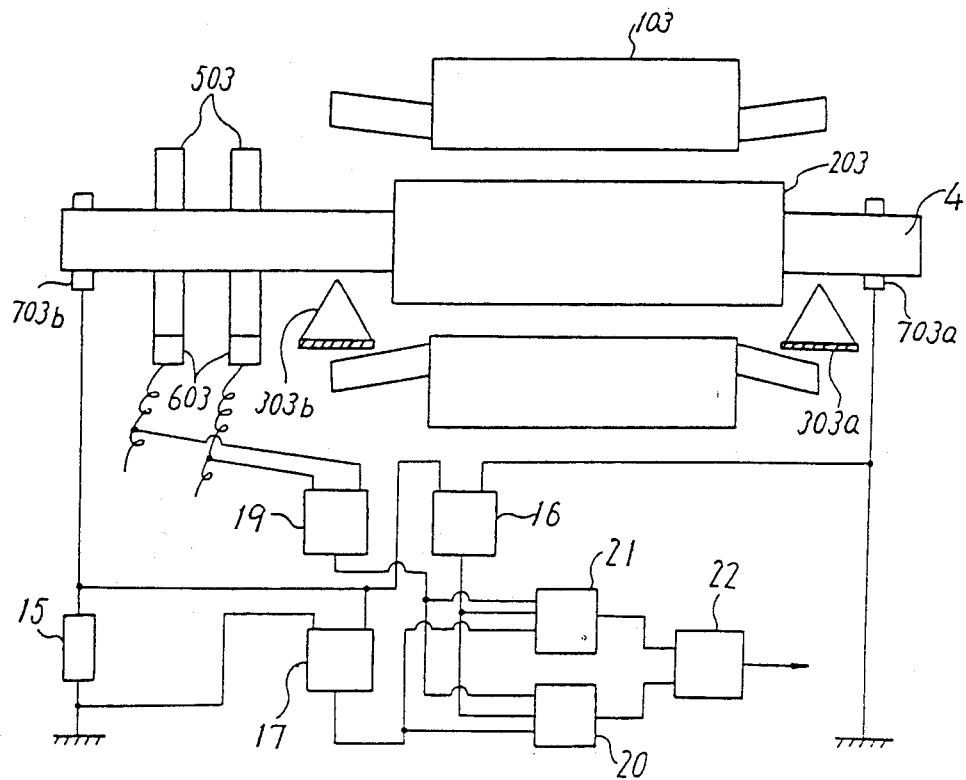
FIGS. 3 and 4 are constructional diagrams illustrating other embodiments of the present invention.

Further, the embodiment of the unit is constructed such that the brush (703b) disposed on an end of the shaft on the side of the slip ring (503) in FIG. 3 is grounded through a resistance circuit (15), and voltage across both ends of the resistance circuit (15) is detected by a voltage detector (17). The present embodiment is further constructed such that detection signals of the respective detectors (16), (19) and (17) are inputted to a frequency comparator (21) and a voltage comparator (20). The frequency comparator (21) separates ripple frequency of the exciter (not shown), output frequency of the rotary electrical apparatus, and the threefold frequency thereof from one another to compare them on the basis of the above detection signals, while the voltage comparator (20) compares the detection signals at their peak values and amounts of direct current, respectively, and as a consequence an abnormality detection circuit (22) is actuated at the time when abnormality occurs in respect of shaft voltage to provide a signal indicating such abnormality.

Thus, in the construction of the embodiment as described above, for instance, magnitude of shaft voltage can be obtained by means of the detector (16). The unit can remarkably be improved in precision and reliability of such detection by comparing the results of the detector (17) with those of the detector (16) in respect of their DC components. Furthermore, when ripple component frequency derived from the detector (19) is continuously compared with the same frequencies of the detectors (16) and (17) to confirm any change, reliability of such unit can be confirmed. As a result, precision and reliability in such detection can significantly be elevated by means of the comparison of the ripple component of the detector (19) with the same frequencies of the detectors (16) and (17). In addition, not only grounding position, but also abnormal state of magnetic flux due to winding short-circuit and the like of, for example, the stator (103) and the rotor (203) are compared with shaft voltage on the basis of comparison in respect of the respective frequencies and DC values, and the results are utilized as the data to be discriminated so that any trouble can be found in its early stages. In the above-mentioned embodiment, although the detector (19) detects the ripple component to field voltage, the detector may detect field current in place of the field voltage, or the detector (19) may be constructed so as to detect both the field voltage and field current. In this case, however, comparison of frequency is carried out by the use of output frequency or the threefold frequency thereof of the rotary electrical apparatus, while field current is utilized for checking the unit or stabilizing phenomena of shaft voltage.

Figure 4:
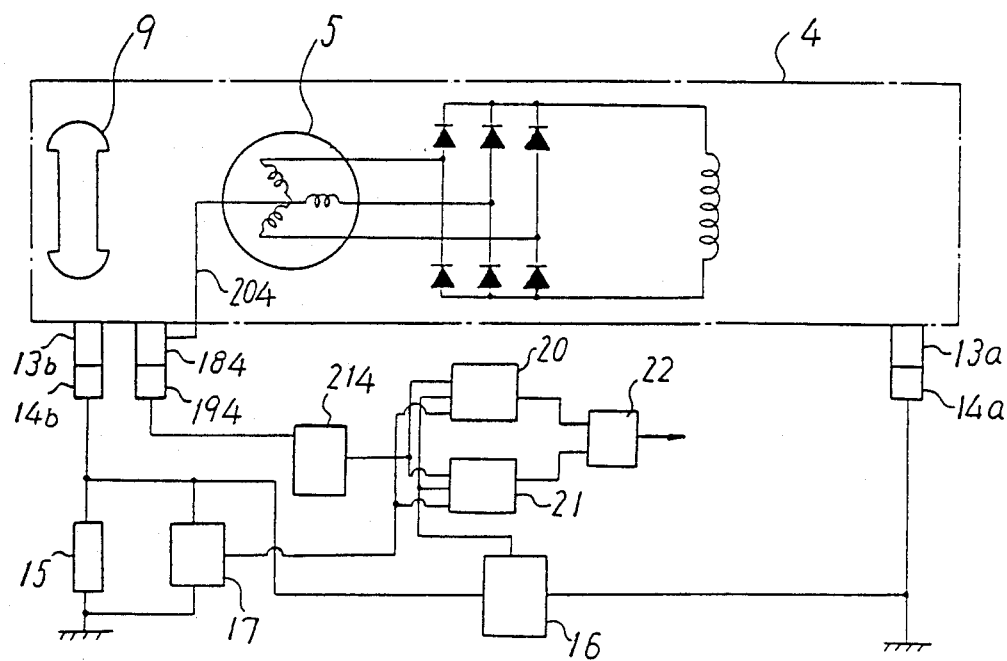

FIG. 4 illustrates another embodiment of the unit for supervising shaft voltage of the brushless synchronous machine illustrated in FIG. 1 in which an end of the rotor shaft (4) of the aforesaid brushless synchronous machine (1), the said end being connected directly to the driving shaft of a turbine or the like, is grounded through a detection slip ring (13a) and a detection brush (14a) contacting with the slip ring (13a), whilst the other end of the rotor shaft if grounded through a detection slip ring (13b), a detection brush (14b) and a resistance circuit (15), whereby shaft voltage produced across two points of the rotor shaft (4) is detected by means of a shaft voltage detector (16). In this case, an earthing brush usually employed may be utilized as the brush (14a). Furthermore, this embodiment of the supervisory unit is constructed such that a detector (17) for detecting a voltage across both ends of the aforesaid resistance circuit (15) is provided. A slip ring (184) for measurement mounted on the rotor shaft (4) and being insulated therefrom as well as a detection brush (194) contacting with the slip ring (184) are provided. The neutral point of an AC exciter (5) is connected with the aforesaid slip ring (184) by means of a lead wire (204), whereby a voltage across a secondary winding neutral point of the AC exciter (5) and the ground is detected by a voltage detector (214) by way of the detection brush (14b) and the detection brush (194). And moreover, detection signals of these voltage detectors (16), (17) and (214) are compared by the voltage comparator (20) at their peak values and amounts of direct current, respectively, and this embodiment of the unit is constructed so as to give signal of abnormality from an abnormality detection circuit (22) at the time when such abnormality occurs. On the other hand, the unit is constructed in such that a frequency comparator (21) separates threefold frequency of output frequency in the AC exciter (5), output frequency of the synchronous machine (1), and the threefold frequency thereof from one another to compare them, and in this arrangement, the abnormality detection circuit (22) is actuated to provide a signal of abnormality at the time when such abnormality occurs.

Accordingly, in the construction illustrated in FIG. 2, magnitude of shaft voltage is detected by means of the detector (17), and the unit can remarkably be improved in precision and reliability of such detection by comparing the results of the detector (17) with those of the detector (16) in respect of their AC and DC components. Furthermore, when significant decrease in threefold frequency of the AC exciter (5) derived from the detector (21) is confirmed, confirmation of grounding can be attained, and at the same time, precision and reliability in such detection can significantly be elevated by means of comparison in respect of the same frequencies of detection signals derived from the detectors (16) and (17). In addition, not only grounding position, but also abnormal state of magnetic flux due to winding short-circuit and the like of, for example, the stator and rotor are compared with shaft voltage on the basis of comparison in respect of the respective frequencies and DC value signal amounts so that any trouble can be found in its early stages.

I claim:

1. In rotary electrical machinery and apparatus of rotary field system type comprising a first detection earthing brush disposed on an end of a rotor shaft, and a second detection earthing brush disposed on the other end of said rotor shaft through a resistance circuit, and said rotary electrical machinery and apparatus receiving power source supply from a thyristor exciter through a slip ring, a supervisory unit for said rotary electrical machinery and apparatus characterized by comprising a first detector for detecting voltage across both ends of said resistance circuit; a second detector for detecting voltage across said both earthing brushes; a third detector for detecting electrical signals of an AC exciter which constitutes a part of the field system side of said rotary electrical machinery and apparatus; and an abnormality detecting means wherein the values of shaft voltage and frequency are detected on the basis of signals of said respective detectors, and comparison is made to determine if said voltage and frequency values are greater than a reference value, and wherein if said values are greater than said reference value, said means provides a signal indicating an abnormal condition.

2. A supervisory unit for rotary electrical machinery and apparatus as claimed in claim 1, wherein said detector for detecting electric signals of the AC exciter detects field system voltage.

3. A supervisory unit for rotary electrical machinery and apparatus as claimed in claim 1, wherein said detector for detecting electric signals of the AC exciter detects field system current.

4. A supervisory unit for rotary electrical machinery and apparatus as claimed in claim 1, wherein said detector for detecting electric signals of the Ac exciter detects voltage across an armature winding neutral point of the AC exciter and the ground.

* * * * *